United States Patent [19]

Greene

[11] Patent Number: 4,500,943
[45] Date of Patent: Feb. 19, 1985

[54] ELECTRONIC PANEL

[75] Inventor: Ted R. Greene, Livermore, Calif.

[73] Assignee: United Security Products, Inc., Livermore, Calif.

[21] Appl. No.: 448,102

[22] Filed: Dec. 9, 1982

[51] Int. Cl.³ ............................................. H05K 7/20
[52] U.S. Cl. ................................ 361/383; 174/16 R; 248/221.3; 248/222.2
[58] Field of Search ............... 361/382, 383, 384, 395, 361/399, 417, 418, 419, 420, 427, 346, 353, 355, 361, 359; 211/41; 339/193 R, 17 C, 112 R, 112 L; 248/221.1, 221.3, 221.4, 222.2, 222.3; 165/67, 165, 76; 174/72 A, 16R

[56] References Cited

U.S. PATENT DOCUMENTS 4,071,218  1/1978  Pecka et al. ................... 248/221.4
4,295,179 10/1981  Read ................................ 361/399
4,361,861 11/1982  Spapens .......................... 361/383

FOREIGN PATENT DOCUMENTS 0259220  9/1962  Australia ......................... 361/356

Primary Examiner—Patrick R. Salce
Assistant Examiner—Gregory D. Thompson
Attorney, Agent, or Firm—Townsend and Townsend

[57] ABSTRACT

The present invention provides an electronics panel which includes a unitary extrusion of substantially constant cross section which is horizontally mounted to a supporting vertical structure. The extrusion has a back plate mounted flush to the supporting structure, a top plate which projects forwardly from the back plate at a position spaced downwardly from the top edge of the back plate, and a front plate parallel to the back plate and projecting downwardly from the forward edge of the top plate. The lower edge of the front plate is spaced upwardly from the lower end of the back plate and is structurally unconnected to the back plate to provide a space between them. The extrusion also has a clip where the back plate and top plate meet and a snap near the lower edge of the back plate. The electronics are mounted on a circuit board with parallel edges, one of which is inserted in the clip and the other engaged by the snap fasten to the circuit board to the extrusion. The circuit board includes a row of connector elements on the bottom edge so that the connector elements are exposed below the lower edge of the front plate.

7 Claims, 9 Drawing Figures

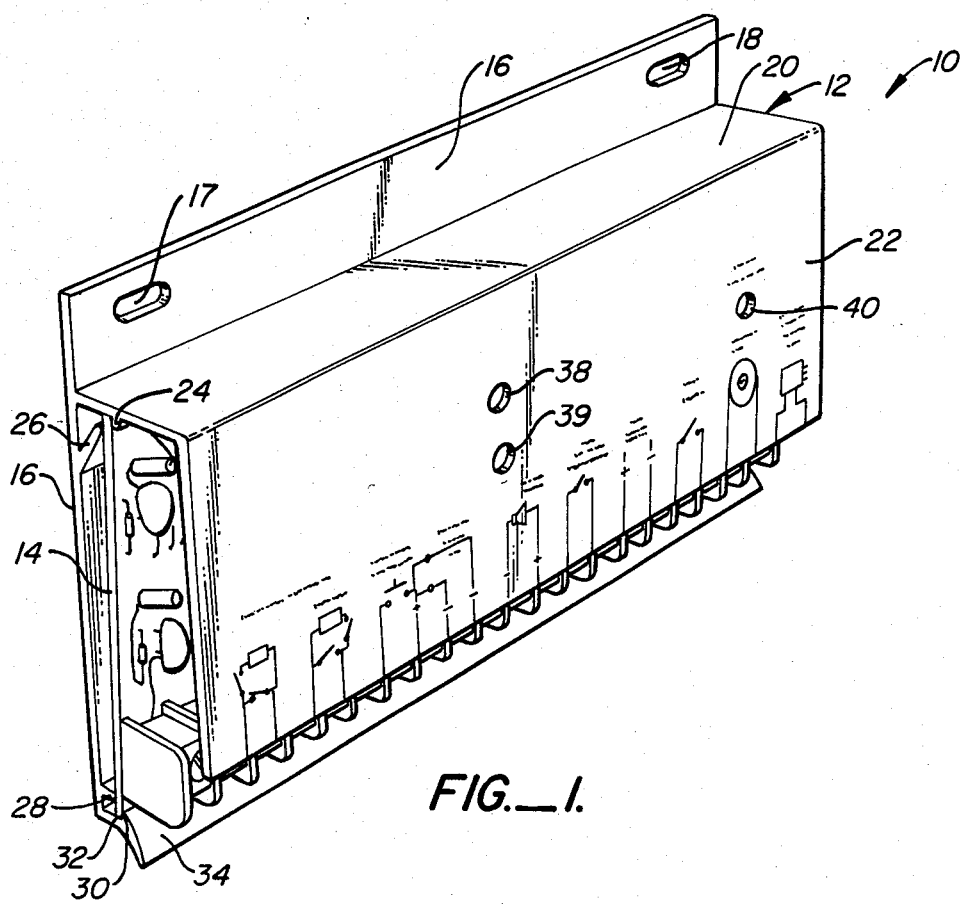
FIG._1.
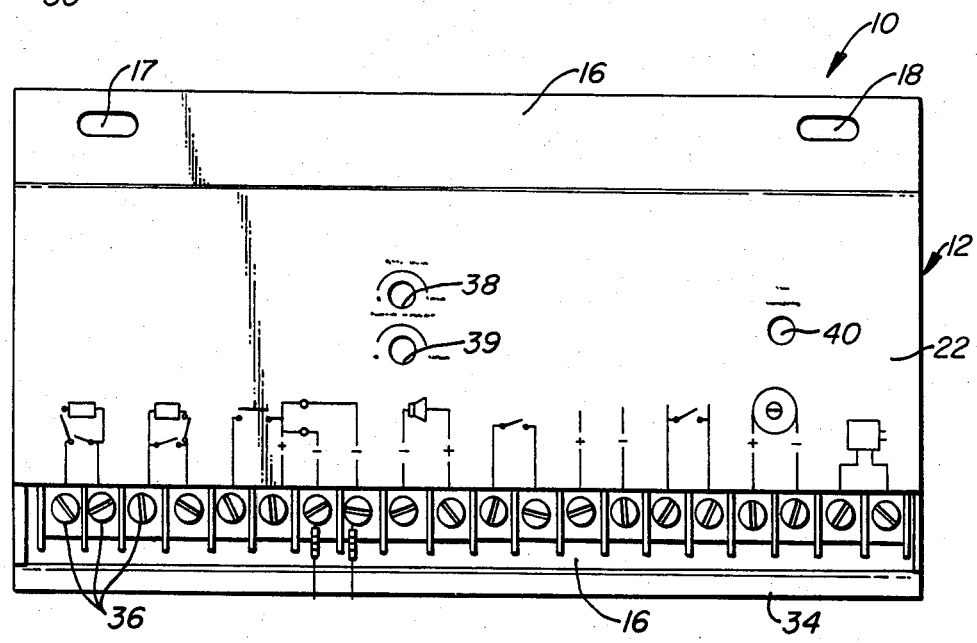
FIG._2.

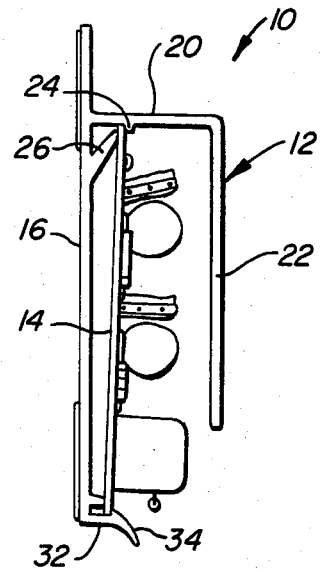
FIG._3.
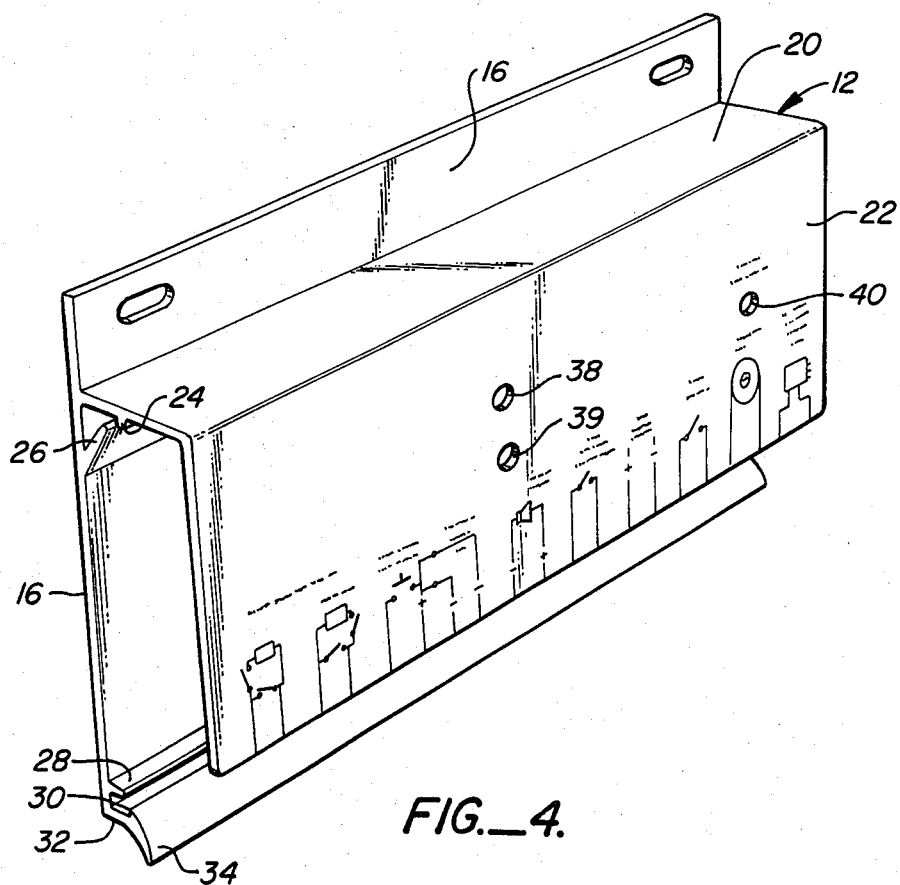
FIG._4.

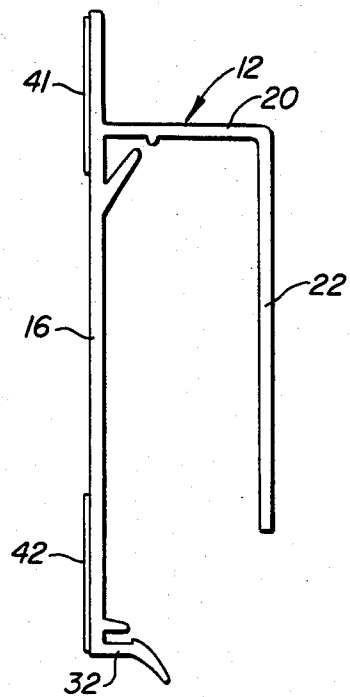
FIG._5A.
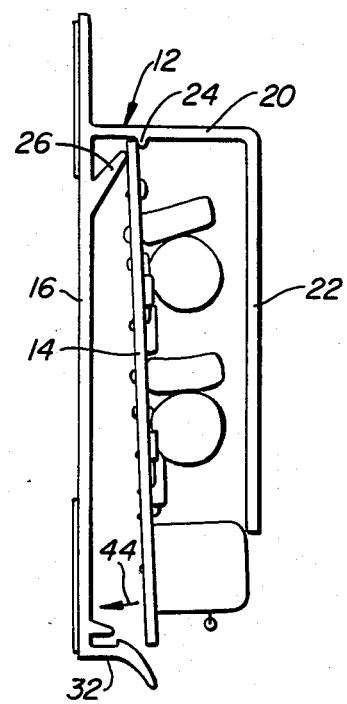
FIG._5B.
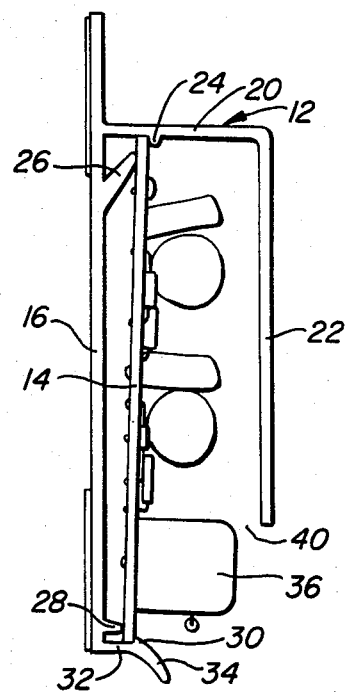
FIG._5C.

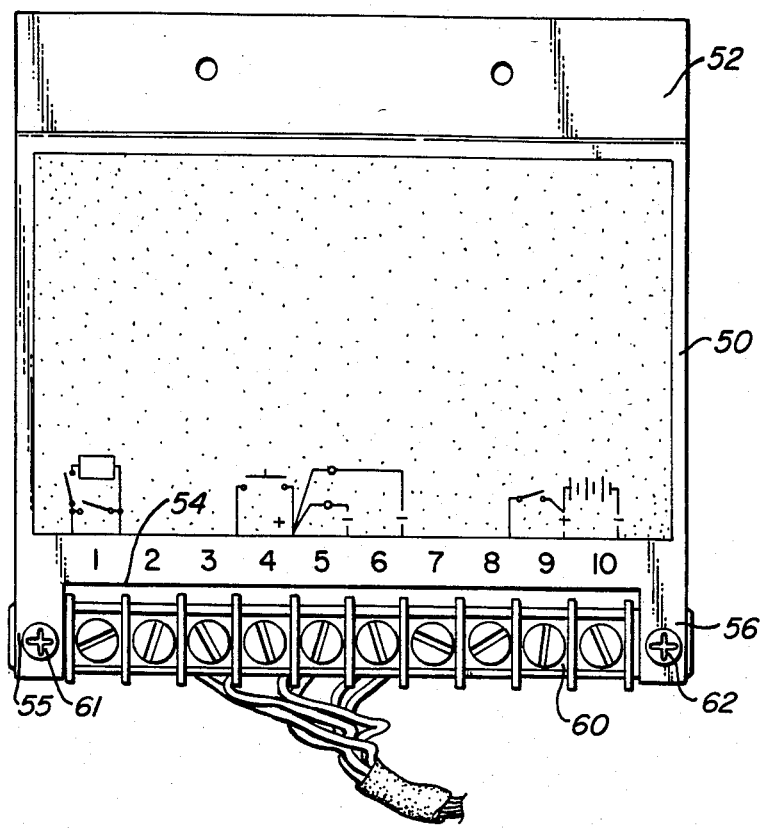
FIG._6.
PRIOR ART
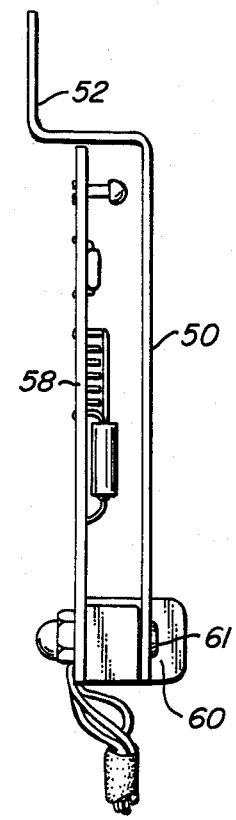
FIG._7.
PRIOR ART

ELECTRONIC PANEL

BACKGROUND OF THE INVENTION

The present invention relates to electronic panels, and in particular to panels for controlling a number of different types of alarms in a commercial or dwelling structure.

Many commercial structures and even certain dwellings have a wide variety of different alarm systems to minimize the likelihood of loss by theft or fire. For example, a structure might have glass breakage detectors on its windows, motion detectors in open areas, and magnetic switches to detect opening of a door or pressure on a carpet. These various alarm devices are normally connected to a common alarm control panel which contains delay circuitry and the like to coordinate the issuance of the actual alarm, e.g., the notification of the police or the activation of visual and aural alert mechanisms.

The number and type of alarms in different buildings varies widely and tailoring a control panel to each particular installation is commercially unfeasible. Instead, general alarm control panels are made available which can be used to coordinate different types of alarm systems. The panels come in different sizes and capacities but each model is designed to handle a variety of alarm situations. To avoid frustration of the alarm system by knowledgeable burglars, the control panel must be tucked away in an inconspicuous and concealed location so that it cannot readily be deactuated.

A typical device of this type is represented by Model P105 formerly produced by United Security Products, Inc., assignee of the present application. The panel includes a metal face in which an L-shaped bracket is formed for mounting, a printed circuit board behind the face, and a plurality of electrical connectors between the circuit board and the face which also serves the structural function of fastening the circuit board to the face. The problem with this type of construction is that where different size control panels are required, the construction of the metal face must be different and the design is relatively inflexible. In addition, by coupling the face and the circuit board at the bottom using the connectors, flow of air upwardly along the circuit board is essentially blocked and the electronic components of the board do not receive the desired cooling. To solve the cooling problem, the panel must be mounted in a relatively open area so that adequate cooling is available, often frustrating the objective of concealing the panel from public view.

SUMMARY OF THE INVENTION

The present invention provides an electronics panel which includes a unitary extrusion of substantially constant cross section which is horizontally mounted to a supporting vertical structure. The extrusion has a back plate mounted flush to the supporting structure, a top plate which projects forwardly from the back plate at a position spaced downwardly from the top edge of the back plate, and a front plate parallel to the back plate and projecting downwardly from the forward edge of the top plate. The lower edge of the front plate is spaced upwardly from the lower end of the back plate and is structurally unconnected to the back plate to provide a space between them. The extrusion also has a clip near the juncture of the back plate and top the plate and a snap near the lower edge of the back plate. The electronics are mounted on a circuit board with parallel edges, one of which is inserted in the clip and the other engaged by the snap to fasten the circuit board to the extrusion. The circuit board includes a row of connector elements on the bottom edge so that the connector elements are exposed below the lower edge of the front plate.

Because the extrusion is of constant cross section, it can be cut to the desired length to accommodate different circuit boards of varying capacities and complexity. The circuit board can be snapped into place using the clip and snap provided for that purpose, and the design of the present invention greatly simplifies the manufacturing process and allows considerable flexibility in the end product. Replacement of a defective circuit board can be accomplished without removal of the extrusion. Further, the lack of a structural connection between the front and back plates at the bottom of the front plate provides a wide spacing through which air can flow to cool the electronics. The panel can thus be concealed in a relatively small enclosed area, greatly minimizing the possibility that the device can be surreptitiously located and then deactivated, or tampered with by unauthorized persons.

The novel features which are characteristic of the invention, as to organization and method of operation, together with further objects and advantages thereof will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a perspective view of the electronics panel of the present invention;

FIG. 2 is a front elevation view of the embodiment of FIG. 1;

FIG. 3 is a side elevation view of the embodiment of FIG. 1;

FIG. 4 is perspective view of the extrusion utilized in the embodiment of FIG. 1 with the circuit board removed;

FIGS. 5A–C are a sequence of side elevation views illustrating the attachment of the circuit board to the extrusion of the embodiment of FIG. 1;

FIGS. 6 and 7 are front and side elevation views respectively of a prior art alarm control panel.

DESCRIPTION OF THE PREFERRED EMBODIMENT

The preferred embodiment 10 of the alarm control panel of the present invention is illustrated generally by way of reference to FIGS. 1–3 in combination. Embodiment 10 includes an extrusion 12, preferably of plastic material, having a constant cross section, and a circuit board 14 bearing the electronics of the system.

Extrusion 12 includes a back plate 16 with apertures 17, 18 near the top for mounting to a vertical support structure, typically a wall. A top plate 20 projects outwardly from back plate 16 below apertures 17, 18, leaving a space to mount a battery (not shown). A front plate 22 depends from the forward edge of top plate 20 to a position spaced upwardly from the lower edge of back plate 16. The lower end of front plate 22 is not structurally connected to back plate 16 and a gap exists between the front and back plates along their entire width.

A bead 24 is located on the underside of top plate 20, and an inclined tab 26 projects from back plate 16 to a position near the bead 24. Bead 24 and tab 26 in combination provide a clip into which one edge of circuit board 14 is inserted. A post 28 projects outwardly from near the bottom of back plate 16, and is juxtaposed to a rib 30 projecting upwardly from a bottom plate 32 of the extrusion. Bottom plate 32 also includes an inclined portion 34 for purposes described hereinafter.

Circuit board 14, typically a printed circuit board, includes a plurality of connector elements 36 along the bottom edge of the board. Connector elements 36 are connected to the electronic equipment mounted on circuit board 14, and simplified graphs of representations of the circuits are exemplified on the outer surface of front plate 22 to guide the installer and aid in troubleshooting. Front plate 22 additionally includes several apertures 38–40 allowing direct access to elements on the circuit board 14 which are used to make adjustments, such as adjustments to the amount of delay provided before the alarm signal is actuated.

The extrusion 12 of the present invention is illustrated before insertion of the circuit board in FIG. 4. It is evident from FIG. 4 that the entire extrusion, except for apertures 17, 18 and 38–40, is of constant cross section. Accordingly, in the manufacture of the alarm control panels, a long plastic extrusion can be cut to the desired dimensions, i.e., the dimensions of the circuit board to be inserted.

Insertion of circuit board 14 into enclosure 12 is illustrated by way of reference to FIGS. 5A–C in combination. In FIG. 5A, only extrusion 12 is shown, together with adhesive pads 41, 42 which may be used to mount the extrusion to a wall. Referring to FIG. 5B, circuit board 14 is inserted within extrusion 12 between the bead 24 and tab 26 forming the clip in the upper portion of the interior of extrusion 12. With the upper edge of circuit board 14 inserted in the clip, the board is rotated as illustrated by arrow 44 so that the lower edge of the board rides along inclined portion 34 and over the rib 30 on lower plate 32 and snaps into position against post 28, as illustrated in FIG. 5C.

It is evident from FIG. 5C that a substantial space 46 exists between the lower edge of front plate 22 and connectors 36 and other portions of circuit board 14 so that air can freely flow into the interior of extrusion 12 and pass out the side to cool the elements of the circuit board.

The prior art is represented by the Model P105 alarm control panel manufactured by United Security Products, Inc. and depicted in FIGS. 6 and 7. In this prior art device, a metal plate 50 is bent to form an L-shaped bracket 52 for mounting. Plate 50 has a rectangular cutout 54 at its lower end with tabs 55, 56 projecting downwardly on either side of the cutout. Circuit board 58 has an insulated connector block 60, and screws 61, 62 pass through the ends of the connector block and fasten circuit board 58 to plate 50.

There are certain clear advantages of the present invention over the prior art as typified by FIGS. 6 and 7. The extrusion of the present invention has a constant cross section and need not be tailored to a particular width of control panel. Moreover, the present invention provides a wide space for the entry of air into the interior of enclosure at the bottom, facilitating the cooling of the electronic components. This latter feature is of particular value in terms of the preferred embodiment of the present invention in which the electronic enclosure controls various types of alarms and should be mounted in a concealed location not readily subject to public access.

While a preferred embodiment of the present invention has been illustrated in detail, it is apparent that modifications and adaptations of that embodiment will occur to those skilled in the art. However, it is to be expressly understood that such modifications and adaptations are within the spirit and scope of the present invention, as set forth in the following claims.

What is claimed is:
1. An electronics panel comprising:
  a unitary extrusion of substantially constant cross section adapted to be horizontally mounted to a supporting vertical structure, said extrusion including a back plate having a front surface and a back surface adapted to be mounted flush to the supporting structure, a top plate projecting forwardly from the front surface of the back plate at a position spaced downwardly from the top edge of the back plate, a front plate parallel to the back plate and projecting downwardly from the forward edge of the top plate with the lower edge of the front plate spaced upwardly from the lower end of the back plate and being structurally unconnected to the back plate to produce a space between them, said extrusion further having a clip near the juncture of the front surface of the back plate and the bottom surface of the top plate and a snap near the lower edge of the back plate; and
  a circuit board having parallel edges, one edge inserted in the clip and the other engaged by the snap to secure the circuit board to the extrusion, said circuit board including a row of connector elements near the edge of the board engaged by the snap so that the connector elements are exposed below the lower edge of the front plate and allow for passage of air upwardly between the front and back plates of the extrusion to cool the circuit board.

2. The panel of claim 1 wherein the portion of the back plate above the top plate includes apertures to facilitate mounting to the supporting structure.

3. The panel of claim 1 wherein the front plate includes apertures allowing direct access to the circuit board.

4. The panel of claim 1 wherein the circuit board is a printed circuit board.

5. The panel of claim 1 wherein the extrusion is a homogeneous plastic extrusion.

6. The panel of claim 1 wherein the clip includes a bead projecting downwardly from the bottom surface of the top plate, and a tab projecting at an acute angle from the front surface of the back plate.

7. The panel of claim 1 wherein the extrusion additionally includes a bottom plate projecting forwardly from the lower edge of the back plate and having a downwardly inclined portion at the distal end thereof to facilitate sliding of the circuit board into engagement with the snap, and in which the snap includes a post projecting forwardly from the front surface of the back plate near the lower edge of the back plate and a rib projecting upwardly from the bottom plate.

* * * * *